United States Patent [19]

Hammond et al.

[11] Patent Number: 4,490,709
[45] Date of Patent: Dec. 25, 1984

[54] INP:FE PHOTOCONDUCTING DEVICE

[75] Inventors: Robert B. Hammond, Los Alamos; Nicholas G. Paulter, Albuquerque; Ronald S. Wagner, Los Alamos, all of N. Mex.

[73] Assignee: The United States of America as represented by the United States Department of Energy, Washington, D.C.

[21] Appl. No.: 447,349

[22] Filed: Dec. 6, 1982

[51] Int. Cl.³ .................. H01L 31/08; H01L 27/14
[52] U.S. Cl. .................................... 338/15; 357/30; 250/211 J
[58] Field of Search .......... 338/15; 250/211 J, 211 R; 357/29, 30, 31

[56] References Cited

U.S. PATENT DOCUMENTS

| | | | |
|---|---|---|---|
| 3,917,943 | 11/1975 | Auston | 250/211 J |
| 3,928,865 | 12/1975 | Yamishita | 357/15 |
| 4,119,840 | 10/1978 | Nelson | 250/211 R |
| 4,158,207 | 6/1979 | Bishop et al. | 357/17 |
| 4,300,107 | 11/1981 | Copeland | 357/16 |
| 4,301,362 | 11/1981 | Mourou | 250/211 J |
| 4,347,437 | 8/1982 | Mourou | 250/211 R |
| 4,376,285 | 3/1983 | Leonberger | 357/30 |

OTHER PUBLICATIONS

"Evidence For Low Surface Recombination Velocity on n-Type InP", Casey et al., Applied Physics Letter, vol. 30, No. 5 (1977), pp. 247-249.

C. W. Isler, "Properties of InP Doped with Fe, Cr, or Co", in: Gallium Arsenide and Related Compounds, 1978. Institute of Physics Conference, Serial #45, Chapter 2, pp. 144-153.

Primary Examiner—C. L. Albritton
Assistant Examiner—C. N. Sears
Attorney, Agent, or Firm—Leonard C. Brenner; Paul D. Gaetjens

[57] ABSTRACT

A photoconducting device fabricated from Fe-doped, semi-insulating InP crystals exhibits an exponential decay transient with decay time inversely related to Fe concentration. Photoconductive gain as high as 5 is demonstrated in photoconducting devices with AuGe and AuSn contacts. Response times from 150 to 1000 picoseconds can be achieved.

3 Claims, 2 Drawing Figures

INP:FE PHOTOCONDUCTING DEVICE

This invention is the result of a contract with the Department of Energy (Contract No. W-7405-ENG-36).

BACKGROUND OF THE INVENTION

The present invention pertains generally to photoconducting devices and more particularly to photoconducting devices having sub-nanosecond response times and photoconductive gains greater than unity.

In recent years interest has developed in bulk semiconductor photoconductors with sub-nanosecond carrier recombination lifetimes for a number of instrumentation applications, including use as photodetectors. Other applications for picosecond photoconductors include generation of fast rising or short duration electrical pulses and picosecond electronic gating. For many of these applications picosecond photoconductors have a significant advantage over conventional high-speed semiconductor devices. Because the speed of response is a property of the material (carrier recombination lifetime) and not of the carrier transit-time, speed is independent of both bias voltage and the dimensions of the device. This permits use in a variety of circuit functions not accessible to conventional devices. In general, material requirements for these applications are high resistivity (low dark current), high carrier mobility (high responsivity), and carrier recombination lifetimes in the picosecond domain determined reproducibly by device fabrication processes. A number of materials have previously been investigated for application as picosecond photoconductors. Amorphous Si and radiation-damaged Si have both shown fast response (4 and 8 picoseconds, respectively) and high resistivity but poor sensitivity due to low carrier mobility (1 and 10 $cm^2$/V-sec, respectively). Semi-insulating GaAs has shown fast response (50 picoseconds) and high resistivity but poorer sensitivity than expected from bulk carrier mobility. Proton-bombarded, semi-insulating InP has shown fast response (less than 100 picoseconds) with relatively high carrier mobility (600 $cm^2$/V-sec) but large dark current.

Semi-insulating InP without additional damage has shown response less than 100 picoseconds, with carrier mobility of 2000 $cm^2$/V-sec, and low dark current. The present invention focusses on this material.

One additional advantage of bulk photoconductors compared to photodiodes for use as photodetectors is their potential for achieving photoconductive gain greater than one. Photoconductive gain is defined as the number of electrons delivered to the external circuit per incident photon on the detector. This means that photoconductive gain is directly proportional to current responsivity (amps/watt). Until this present invention, gain has not been reported in a picosecond photoconductor. Photoconductive gains greater than unity have been reported in photoconductive detectors in which the speed of response is controlled by the transit time of holes across the active region, as opposed to recombination within the active region. These devices can yield maximum gains equal to the ratio of electron to hole drift velocities (~2 for Si, ~10 for GaAs and InP). However, because the mechanism controlling speed of response is carrier transit-time and not bulk recombination, these devices cannot perform the range of circuit functions accessible to bulk photoconductors as described above. Also, bulk photoconductors can in principle achieve higher gains because carrier recombination and transit-time are independent so that speed, gain, and device dimensions can be traded off against each other depending on the desired application. (For example: a contact spacing of one micron in an InP photoconductor with peak electron velocity of $2.6 \times 10^7$ cm/sec and a carrier recombination lifetime of 100 picoseconds implies a gain of 25 with a speed of response of 100 picoseconds).

SUMMARY OF THE INVENTION

It is therefore an object of the present invention to provide a very high speed photoconducting device.

It is another object of the present invention to provide a bulk photoconducting device having a photoconductive gain greater than unity.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects, and in accordance with the purposes of the present invention, as embodied and broadly described herein, the apparatus of the present invention may comprise a wafer of Fe-doped, semi-insulating InP, having a bulk resistivity of greater than $2 \times 10^7$ ohm-cm to which is evaporated and annealed at temperatures at or above 425° C. a pair of closely spaced contacts on the order of 25 micron separation. Light pulses impinging on the contact separation area produces a very high speed photoconducting effect exhibiting transient photoconductive gain.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings.

DETAILED DESCRIPTION OF THE PREFERRED EMBODIMENT OF THE INVENTION

The semiconductor material 11 for the present invention is prepared from a wafer of Fe-doped, semi-insulating InP, having bulk resistivity of greater than $2 \times 10^7$ ohm-cm. Fe concentrations in the semiconductor material 11 can be determined by secondary-ion mass spectroscopy (SIMS). Preferably, the measured Fe concentrations can be from $2 \times 10^{15}$ to $4 \times 10^{16}$ $cm^{-3}$.

A photoconducting device 13 made in accord with the present invention uses the semiconductor material 11 cut to dimensions of $0.1 \times 0.2 \times 0.05$ $cm^3$. The semiconductor material 11 so cut is then polished in a 3% Br-methanol solution to remove surface damage. Then a pair of AuGe or AuSn evaporated contacts 15 are formed on the semiconductor material 11 with a 25 micron wide gap (active) region 17 delineated by lift-off photolithography. Preferably the pair of contacts 15 are evaporated and annealed briefly at 450° C. with contact spacing of 1 mm leaving an active region 17 of 1×2.4 mm². So made, the capacitance of the photoconducting device will be approximately 0.034 pF at 5 GHz when measured on a network analyzer.

To operate and test the photoconducting device 13, it can be used so as to replace the center conductor in a 50 ohm microstrip transmission line on 1 mm thick alumina substrates. Electrical and mechanical connection from the photoconducting device 13 to the center conductor can be made using a silver paint. Microstrip to coaxial transitions can be easily made using SMA bulkhead connectors.

The photoconducting device 13 so connected can be used or tested with one end of the microstrip transmission line biased and the other end connected to a sampling oscilloscope. In use, the active region 17 of the photoconducting device 13 can be excited with a mode-locked, cavity-dumped dye laser operating at 4 MHz, 780 nm wavelength, and 15 picosecond pulse duration.

Figure 1:
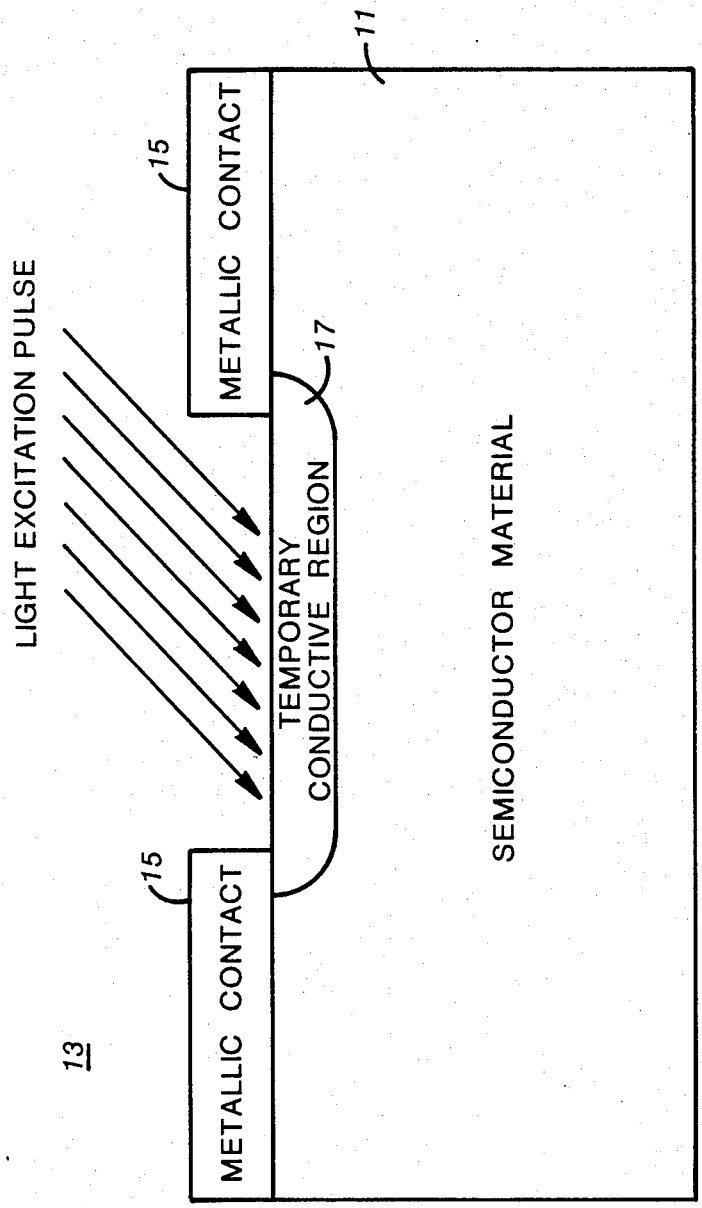
FIG. 1 is a schematic diagram illustrating the operation of a photoconducting device of the present invention.
Figure 2:
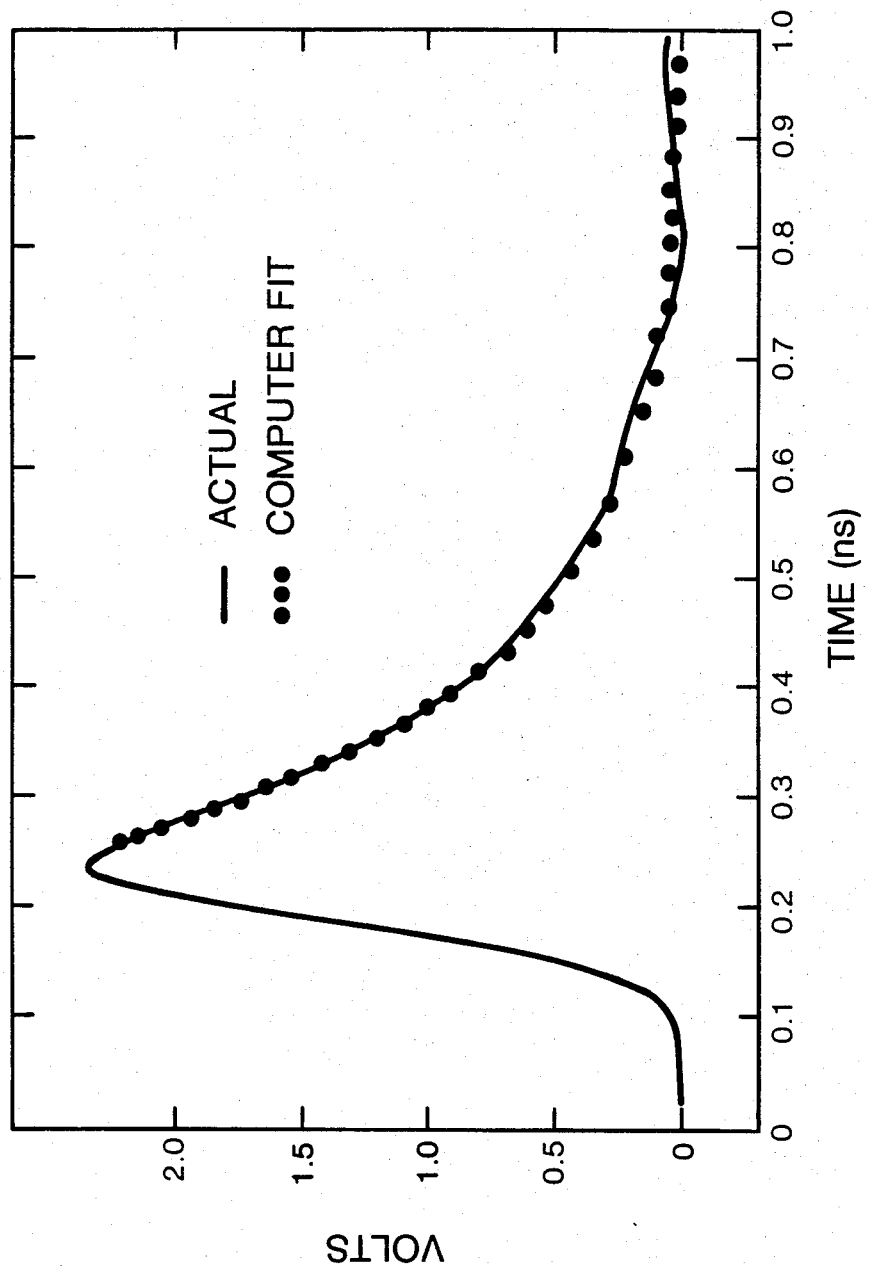
FIG. 2 is a timing diagram illustrating characteristic decay times of the photoconducting device of FIG. 1.

Typical pulse photoresponse characteristics, see FIG. 2, show a risetime (10% to 90%) of less than 80 picoseconds and a fall time exceeding the risetime by at least a factor of two thus giving a good measure of the photoconducting device 13 response due to bulk recombination of carriers in the active region 17 of the semiconductor material 11. The fall time decay transients show an exponential character well fitted to a single exponential least squares computer algorithm.

Decay times are typically on the order of 150 to 1000 picoseconds and are inversely correlated to Fe concentrations. For heavily doped crystals, a smaller fraction of the total Fe present may actually become electrically active.

If one assumes that the photoconducting device 13 acts as a current source (valid as long as the contact 15 resistance and load impedance are much less than the on-state resistance of the photoconducting device 13), peak current response to an optical impulse may be written:

$$I = \frac{(1 - R)qv_D E}{SW}$$

where R is the optical reflectivity of the material, q is the electronic charge, $v_D$ is the carrier drift velocity, E is the incident optical energy, S is the contact spacing on the photoconductor, and W is the photon energy. In this equation only one carrier type, electrons, are assumed. This is done because electrons have much higher drift velocities than holes in InP at low electric fields. From this equation the effective electron drift velocity can be inferred from impulse photoresponse measurements.

Importantly, the photoconducting device 13 of the present invention can exhibit transient photoconductive gain. Transient photoconductive gain is defined as the ratio of electrons delivered to the external circuit per non-reflected incident photon. Such gains as high as 3 can be obtained from photoconducting devices 13 having contact 15 spacing of 25 microns and concentrations of $5 \times 10^{15}$ cm$^{-3}$ Fe. This indicates that the electrical contacts 15 to the device are injecting electrons.

Contact systems used with InP (AuGe and AuSn) annealing at 425° C. or above produces injecting contacts 15 which can yield gains greater than unity. Contacts 15 annealed below this temperature yield blocking contacts. Typically, for AuSn contacts and 400° C. anneal, the response time is approximately 100 picoseconds and the gain (determined from the integral of the impulse current response and the number of non-reflected incident photons) is approximately one. For the case of the 450° C. annealing, however, the response time is several hundred picoseconds and the gain is approximately 5. Further, for such devices annealed at 400° C. the speed of response is limited by electron transit time across the active region as in a photodiode, whereas for such devices annealed at 425° C. or above the speed of response is higher and determined by carrier recombination in the active region 17 as in a bulk photoconductor.

The foregoing description of the preferred embodiment of the invention has been presented for purposes of illustration. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A high speed photoconducting device exhibiting photoconductive gain comprising:
   a wafer of Fe-doped, semi-insulating InP having a bulk resistivity greater than $2 \times 10^7$ ohm-cm and Fe concentration in the order of $2 \times 10^{15}$ to $4 \times 10^{16}$ cm$^{-3}$; and
   a pair of gold alloy contacts evaporated and annealed at a temperature of at least 425° C. on said wafer having a contact separation on the order of 25 microns therebetween for the impingement thereon by photons.

2. A photoconducting device comprising:
   a wafer of Fe-doped, semi-insulating InP having a bulk resistivity greater than $2 \times 10^7$ ohm-cm and Fe concentration in the order of $2 \times 10^{15}$ to $4 \times 10^{16}$ cm$^{-3}$; and
   a pair of AuGe contacts evaporated and annealed at a temperature above 425° C. on said wafer having a contact separation on the order of 25 microns therebetween for the impingement thereon by photons.

3. A photoconducting device comprising:
   a wafer of Fe-doped, semi-insulating InP having a bulk resistivity greater than $2 \times 10^7$ ohm-cm and Fe concentration in the order of $2 \times 10^{15}$ to $4 \times 10^{16}$ cm$^{-3}$; and
   a pair of AuSn contacts evaporated and annealed at a temperature above 425° C. on said wafer having a contact separation on the order of 25 microns therebetween for the impingement thereon by photons.

* * * * *